(12) United States Patent
Cantone et al.

(10) Patent No.: US 9,209,038 B2
(45) Date of Patent: Dec. 8, 2015

(54) METHODS FOR FABRICATING INTEGRATED CIRCUITS USING SELF-ALIGNED QUADRUPLE PATTERNING

(71) Applicant: GLOBALFOUNDRIES, Inc., Grand Cayman (KY)

(72) Inventors: Jason Richard Cantone, Mechanicville, NY (US); Linus Jang, Clifton Park, NY (US); Ryan Ryoung-Han Kim, Albany, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 33 days.

(21) Appl. No.: 14/267,959

(22) Filed: May 2, 2014

(65) Prior Publication Data

US 2015/0318181 A1 Nov. 5, 2015

(51) Int. Cl.
*H01L 21/00* (2006.01)
*H01L 21/308* (2006.01)
*H01L 29/66* (2006.01)

(52) U.S. Cl.
CPC ...... *H01L 21/3086* (2013.01); *H01L 29/66795* (2013.01)

(58) Field of Classification Search
CPC ..................... H01L 21/3086; H01L 29/66795
See application file for complete search history.

(56) References Cited

U.S. PATENT DOCUMENTS 8,288,083 B2 * 10/2012 Zhang et al. ................. 430/325
8,309,462 B1 * 11/2012 Yoshida et al. .............. 438/672

\* cited by examiner

*Primary Examiner* — Richard Booth
(74) *Attorney, Agent, or Firm* — Ingrassia Fisher & Lorenz, P.C.

(57) ABSTRACT

Methods for fabricating integrated circuits and for forming masks for fabricating integrated circuits are provided. An exemplary method for fabricating an integrated circuit includes providing a patternable structure having first and second regions and including upper and lower mandrel layers. The method etches upper mandrels from the upper mandrel layer in the first and second regions. The method includes forming first upper spacer structures having a first width adjacent upper mandrels in the first region and forming second upper spacer structures having a second width not equal to the first width adjacent upper mandrels in the second region. The method etches the lower mandrel layer using the first and second upper spacer structures as an etch mask to form lower mandrels. Further, the method includes forming spacers adjacent the lower mandrels and etching a material using the spacers as an etch mask to form variably spaced features.

20 Claims, 7 Drawing Sheets

METHODS FOR FABRICATING INTEGRATED CIRCUITS USING SELF-ALIGNED QUADRUPLE PATTERNING

TECHNICAL FIELD

The technical field generally relates to methods for fabricating integrated circuits, and more particularly relates to methods for fabricating integrated circuits using self-aligned quadruple patterning (SAQP) processes to form variably spaced features.

BACKGROUND

Fin-type field effect transistors (FinFETs) have emerged as an effective approach to support the scaling of integrated circuits, as FinFETs require less area than planar transistors. FinFETs utilize fin structures of semiconductor material that function as channels for the FinFETs. Fin structures may be formed in logic areas and memory areas on a semiconductor substrate through general semiconductor patterning processes.

The continued scaling of integrated circuits has generated a demand for methods for forming nanometer-sized features, such as fin structures, that are separated by nanometer-sized distances, i.e., have nanometer-sized pitches. As the limits of optical resolution are approached in current lithography processes, double patterning processes have been used to create critical dimensions (CD) and spaces that are beyond the capability of a single lithography step. Specifically, while a conventional lithographic process can be used to form a line-width equal to a minimum critical dimension associated with the lithographic process, a double patterning process can be used to form a line-width smaller than the minimum critical dimension rendered through a single exposure. Double patterning techniques include "pitch split" (also called litho-etch litho-etch, or LELE) and self-aligned double patterning (SADP), also called sidewall image transfer (SIT).

To obtain even smaller feature sizes, self-aligned quadruple patterning (SAQP) or double SIT techniques have been proposed for planar transistors. However, the use of self-aligned quadruple patterning to form fin structures is problematic. For example, while fin structures in a logic area and fin structures in an NMOS portion of an SRAM may be formed with a uniform pitch, fin structures in a PMOS portion of an SRAM typically require a different pitch or pitches. In other words, if a single fin structure formation process is used to form the fin structures on a semiconductor substrate, the process may be required to form variably spaced fin structures.

Accordingly, it is desirable to provide methods for fabricating integrated circuits that provide for variably spaced features. In addition, it is desirable to provide methods for fabricating integrated circuits that use self-aligned quadruple patterning processes to form variably spaced semiconductor fin structures. Furthermore, other desirable features and characteristics will become apparent from the subsequent detailed description and the appended claims, taken in conjunction with the accompanying drawings and the foregoing technical field and background.

BRIEF SUMMARY

Methods for fabricating integrated circuits and for forming masks for fabricating integrated circuits are provided. In a first embodiment, a method for fabricating an integrated circuit includes providing a patternable structure having a first region and second region and including an upper mandrel layer overlying a lower mandrel layer. The method etches upper mandrels from the upper mandrel layer in the first region and the second region of the patternable structure. Further, the method forms first upper spacer structures having a first width adjacent the upper mandrels in the first region and forms second upper spacer structures having a second width not equal to the first width adjacent the upper mandrels in the second region. The method includes etching the lower mandrel layer using the first upper spacer structures and the second upper spacer structures as an etch mask to form lower mandrels. The method further includes forming lower spacers adjacent the lower mandrels and etching a material using the lower spacers as an etch mask to form variably spaced features.

In another embodiment, a method for fabricating an integrated circuit includes providing an upper mandrel layer overlying a lower mandrel layer overlying a semiconductor material. The method further includes performing a self-aligned quadruple patterning (SAQP) process to form variably spaced semiconductor fin structures from the semiconductor material. The SAQP process includes etching the upper mandrel layer to form a first upper mandrel distanced from a second upper mandrel. Further, the SAQP process includes forming first upper spacer structures adjacent the first upper mandrel and forming second upper spacer structures adjacent the second upper mandrel. Each first upper spacer structure has a first width and each second upper spacer structure has a second width not equal to the first width. The SAQP process includes removing the upper mandrels, etching the lower mandrel layer using the upper spacer structures as a first etch mask to form lower mandrels having sidewalls, forming lower spacers adjacent the lower mandrels, and removing the lower mandrels. Further, the SAQP process etches the semiconductor material using the lower spacers as a second etch mask to form the variably spaced semiconductor fin structures.

In another embodiment, a method for forming a mask for fabricating an integrated circuit is provided. The method includes etching an upper mandrel layer to form a first upper mandrel in a first region and a second upper mandrel in a second region. The method forms first upper spacer structures adjacent the first upper mandrel and forms second upper spacer structures adjacent the second upper mandrel. The method includes removing the upper mandrels and etching a lower mandrel layer using the first and second upper spacer structures as an etch mask to form lower mandrels. The method further includes forming lower spacers adjacent the lower mandrels and removing the lower mandrels. The lower spacers define the mask for fabricating an integrated circuit with variably spaced features

BRIEF DESCRIPTION OF THE DRAWINGS

Embodiments of methods for fabricating integrated circuits using self-aligned quadruple patterning and for forming masks for fabricating integrated circuits will hereinafter be described in conjunction with the following drawing figures, wherein like numerals denote like elements, and wherein.

DETAILED DESCRIPTION

The following detailed description is merely exemplary in nature and is not intended to limit the methods for fabricating integrated circuits using self-aligned quadruple patterning or methods for forming masks for fabricating integrated circuits as claimed herein. Furthermore, there is no intention to be bound by any expressed or implied theory presented in the preceding technical field, background or brief summary, or in the following detailed description.

In accordance with the various embodiments herein, methods for fabricating integrated circuits using self-aligned quadruple patterning techniques and methods for forming masks for fabricating integrated circuits are provided. The methods described herein provide for forming variably spaced features, i.e., features with more than one pitch, at reduced feature sizes, such as on the order of nanometers. Further, the methods allow for forming features, such as fin structures, in logic areas and in memory areas of an integrated circuit using self-aligned quadruple patterning techniques. In particular, in accordance with an exemplary method described herein, a first group and a second group of mandrels are formed over a lower mandrel layer. First sidewall spacers are formed adjacent the first group of mandrels and second sidewall spacers are formed adjacent the first sidewall spacers and adjacent the second group of mandrels. The mandrels are removed and the underlying mandrel layer is etched using the first sidewall spacers and second sidewall spacers as etch masks to form variably spaced features. The processes described herein may be employed at various stages during integrated circuit fabrication including, but not limited to, gate level patterning and patterning of fins during finFET fabrication, as well as other patterning stages during front-end-of-line (FEOL) or back-end-of-line (BEOL) processing.

FIGS. 1-14 illustrate steps in accordance with an embodiment of a method for fabricating an integrated circuit 10. FIGS. 15-21 illustrate further steps for processing the integrated circuit of FIG. 6 in accordance with other embodiments of a method for fabricating an integrated circuit 10. Various steps in the design and composition of integrated circuits are well known and so, in the interest of brevity, many conventional steps will only be mentioned briefly herein or will be omitted entirely without providing the known process details. Further, it is noted that integrated circuits include a varying number of components and that single components, such as mandrels, shown in the illustrations may be representative of multiple components.

Figure 1:
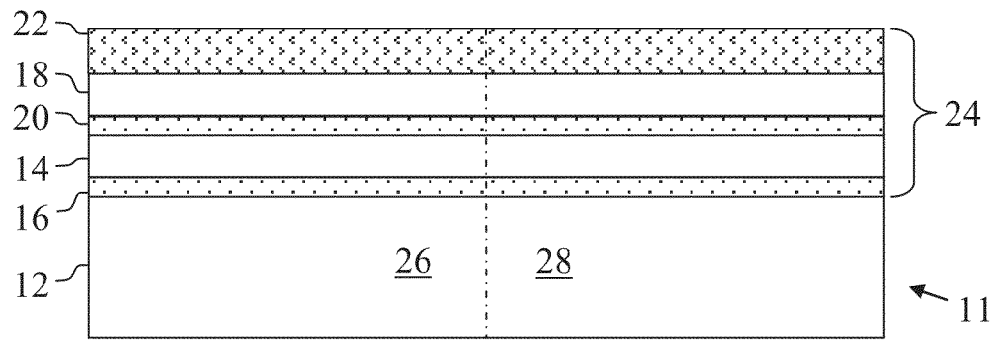
FIG. 1-21 illustrate, in cross section, a portion of an integrated circuit and method steps for fabricating the integrated circuit with a self-aligned quadruple patterning process in accordance with various embodiments herein.

In the exemplary embodiment of FIG. 1, a method for fabricating an integrated circuit 10 includes providing a patternable structure 11. The exemplary patternable structure 11 includes a semiconductor substrate 12. An exemplary semiconductor substrate 12 is formed from semiconductor material such as silicon, including the relatively pure silicon materials typically used in the semiconductor industry as well as silicon admixed with other elements, such as germanium and the like. Alternatively, the semiconductor substrate 12 can be realized as germanium, gallium arsenide, and the like, or the semiconductor substrate 12 can include layers of different semiconductor materials. In an exemplary embodiment the semiconductor substrate 12 is realized as a bulk silicon substrate; however, it may be realized as a silicon-on-insulator (SOI) substrate.

As shown, a lower patternable layer 14, such as a mandrel layer, is formed overlying the semiconductor substrate 12. As used herein "overlying" means "on" and "over". In this regard, the lower patternable layer 14 may lie directly on the semiconductor substrate 12 such that it makes physical contact with the semiconductor substrate 12 or it may lie over the semiconductor substrate 12 such that another material layer, for example, a lower hard mask layer 16, is interposed between the semiconductor substrate 12 and the lower patternable layer 14. Further, as used herein, "overlying", "over", "upper", "lower", "vertical" and "horizontal" describe the orientation and/or location of a feature or element within the consistent but arbitrary frame of reference illustrated by the drawings.

In an exemplary embodiment, the lower patternable layer 14 is amorphous silicon, polycrystalline silicon, or another material suitable for use in required patterning steps. In an exemplary embodiment, the lower patternable layer 14 is blanket-deposited by a plasma-enhanced chemical vapor deposition (PECVD) process, a low pressure chemical vapor deposition (LPCVD), or another chemical vapor deposition (CVD) process. An exemplary lower patternable layer 14 has a thickness of about 80 nanometers (nm) to about 120 nm, such as about 100 nm. An exemplary lower hard mask layer 16 is deposited silicon nitride, silicon oxide, silicon oxynitride, amorphous carbon, a carbon-doped silica (SiCOH), another material suitable for the patterning steps of the process, or a stack of such materials. In an exemplary embodiment, the lower hard mask layer 16 is formed by blanket-deposition using, for example, a plasma-enhanced chemical vapor deposition process, a low pressure chemical vapor deposition, or another chemical vapor deposition process. An exemplary lower hard mask layer 16 has a thickness of about 25 nm to about 50 nm, such as about 40 nm.

As shown, an upper patternable layer 18, such as an upper mandrel layer, is formed overlying the lower patternable layer 14. The upper patternable layer 18 may lie directly on the lower patternable layer 14 or it may lie over the lower patternable layer 14 such that another material layer, for example, an upper hard mask layer 20, is interposed between the lower patternable layer 14 and the upper patternable layer 18. In an exemplary embodiment, the upper patternable layer 18 is amorphous silicon, polycrystalline silicon, or another material suitable for use in lithography steps. In an exemplary embodiment, the upper patternable layer 18 is blanket-deposited by a plasma-enhanced chemical vapor deposition process, a low pressure chemical vapor deposition, or another chemical vapor deposition process. An exemplary upper patternable layer 18 has a thickness of about 80 nm to about 120 nm, such as about 100 nm. An exemplary upper hard mask layer 20 is deposited silicon nitride, silicon oxide, silicon oxynitride, amorphous carbon, a carbon-doped silica (SiCOH), or another material suitable for the lithography steps of the process. An exemplary upper hard mask layer 20 is formed by blanket-deposition using, for example, a plasma-enhanced chemical vapor deposition process, a low pressure chemical vapor deposition, or another chemical vapor deposition process. An exemplary upper hard mask layer 20 has a thickness of about 25 nm to about 50 nm, such as about 40 nm. As further shown, a masking layer 22 may be formed over the upper patternable layer 18. An exemplary masking layer 22 is photoresist, though another suitable patternable material may be used.

The lower hard mask layer 16, lower patternable layer 14, hard mask layer 20, upper patternable layer 18, and masking layer 22 are considered to form a mask stack 24. The mask stack 24 may include other layers, such as anti-reflective coating layers, etch stop layers, optical dispersive layers, or other desired layers interposed below or over the hard lower mask layer 16, lower patternable layer 14, hard mask layer 20, upper patternable layer 18, or masking layer 22. Further, the mask stack 24 may include additional mask layers and patternable layers to provide for additional patterning steps. The mask stack 24 lies over the semiconductor substrate 12 and is processed to form a mask for patterning the semiconductor substrate 12 as described herein. The patternable structure 11 may be considered to include two regions 26 and 28 that are processed differently to form variably spaced features from underlying material as described below.

Figure 2:
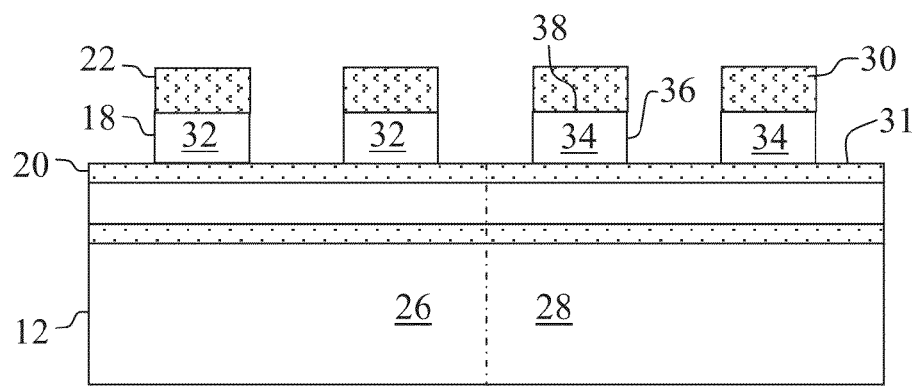

In FIG. 2, the masking layer 22 is exposed, developed or otherwise patterned in a lithographic process to form closed mask segments 30. The closed mask segments 30 selectively cover portions of the upper patternable layer 18. An etch process is performed to etch exposed portions of the upper patternable layer 18. In an exemplary embodiment, a reactive ion etch (RIE) is performed to etch the exposed portions of the upper patternable layer 18. The etch process stops on an upper surface 31 of the upper hard mask layer 20. As a result, upper mandrels including first upper mandrels 32 in the first region 26 and second upper mandrels 34 in the second region 28 are formed overlying the hard mask layer 20. Exemplary upper mandrels 32 and 34 are formed with substantially vertical sidewalls 36 and substantially horizontal top surfaces 38.

Figure 3:
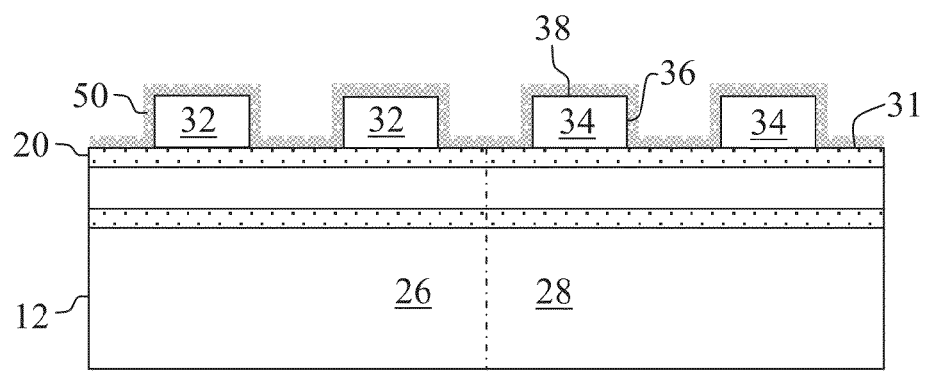

The method may continue in FIG. 3 with the removal of the closed mask segments 30 and the formation of a spacer-forming layer 50 over the upper hard mask layer 20, the first upper mandrels 32 and the second upper mandrels 34. An exemplary spacer-forming layer 50 is conformally deposited such as by atomic layer deposition (ALD), plasma-enhanced chemical vapor deposition, a low pressure chemical vapor deposition, or another chemical vapor deposition process. An exemplary spacer-forming layer 50 contacts the upper surface 31 of the upper hard mask layer 20 and the sidewalls 36 and top surfaces 38 of the upper mandrels 32 and 34 and encapsulates the upper mandrels 32 and 34. Spacer-forming layer 50 may be formed of silicon nitride, silicon dioxide, or any type of organic or inorganic material having etch selectivity with respect to upper mandrels 32 and 34.

Figure 4:
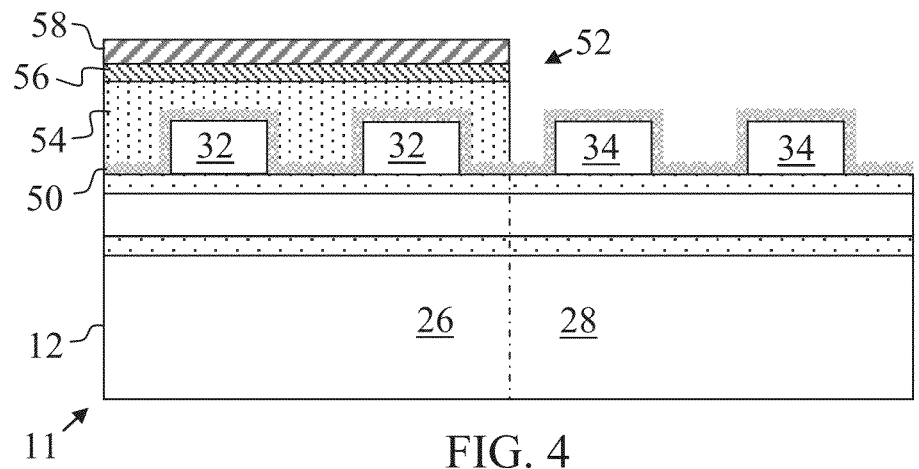

In FIG. 4 a mask 52 is formed and pattered over the patternable structure 11. An exemplary mask 52 includes a plurality of lithographic-aiding layers. For example, mask 52 may include an optical planarizing layer (OPL) 54, an anti-reflective coating (ARC) layer 56 overlying the OPL 54, and a photoresist layer 58 overlying the ARC layer 56. The OPL 54 is formed at a predetermined thickness to provide reflectivity and topography control during etching. Within the three lithographic-aiding layers, the photoresist layer 58 is typically approximately the same thickness as the OPL 54 (e.g., approximately 200 nanometers (nm)), while the ARC layer 56 is typically less than half the thickness of the OPL 54 (e.g., approximately 80 nm). In an exemplary embodiment, the OPL 54 is deposited over the patternable structure 11 by spin coating. An exemplary OPL 54 includes an organic polymer including carbon, hydrogen, oxygen, and optionally fluorine. For example, OPL 54 can include hydrocarbons and/or hydrofluorocarbons. In an exemplary embodiment, the ARC layer 56 is deposited by spin coating. An exemplary ARC layer 56 contains silicon and can include a hydrocarbon based material having a different material composition than the OPL 54.

As shown, the photoresist layer 58 is patterned and the ARC layer 56 and OPL 54 are etched such that the mask 54 selectively covers the first region 26 of the patternable structure 11, including the first upper mandrels 32. Accordingly, the mask 54 exposes the second region 28 of the patternable structure 11, including the second upper mandrels 34 and the spacer-forming layer 50.

Figure 5:
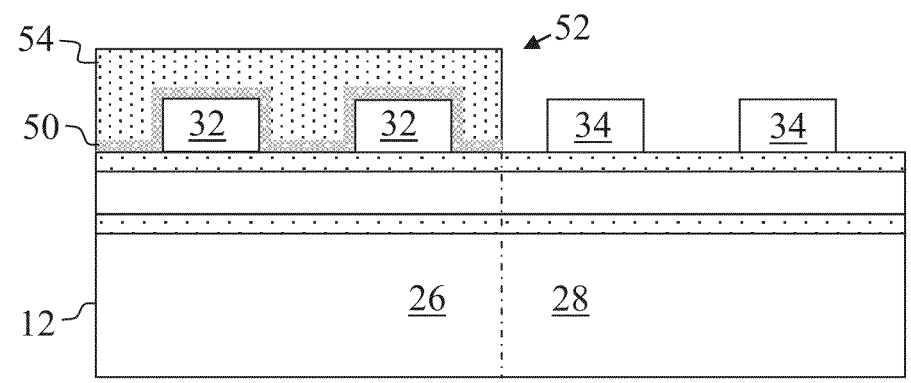

In FIG. 5, the spacer-forming layer 50 is etched and removed from the second region 28 including from the second upper mandrels 34. An exemplary etch uses an RIE process with chemistries based upon $CHF_3$ or $CF_4$ to etch silicon oxide or silicon oxynitride, or upon $CHF_3/O_2$ to etch silicon nitride. The etch process may remove the photoresist layer 58 and the ARC layer 56, and may etch into the OPL 54. In exemplary embodiments, at least a portion of the OPL 54 remains overlying the spacer-forming layer 50 in the first region 26.

Figure 6:
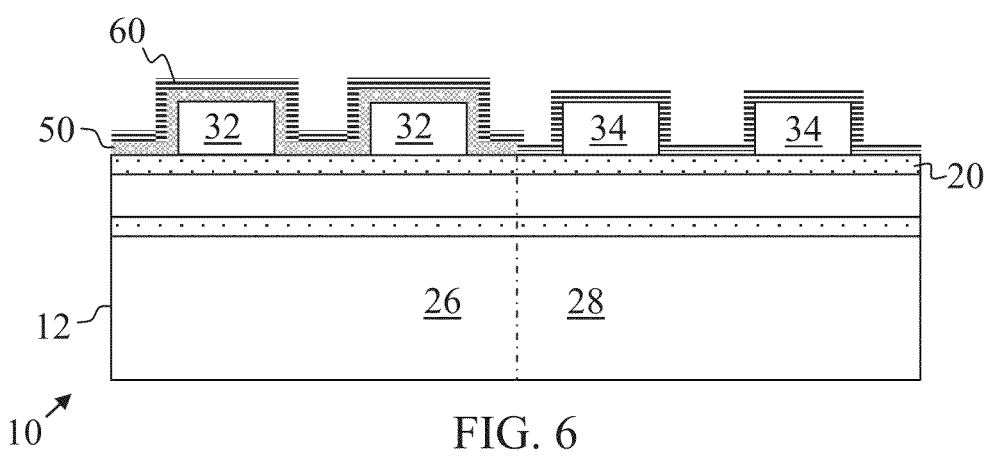

The method may continue in FIG. 6 with the removal of the OPL 54 and the formation of a spacer-forming layer 60 over the remaining spacer-forming layer 50 in the first region 26 and over the upper hard mask layer 20 and the second upper mandrels 34 in the second region 28. An exemplary spacer-forming layer 60 is conformally deposited such as by atomic layer deposition (ALD), plasma-enhanced chemical vapor deposition, a low pressure chemical vapor deposition, or another chemical vapor deposition process. An exemplary spacer-forming layer 60 contacts the sidewalls and horizontal surfaces of the spacer-forming layer 50, the upper hard mask layer 20 and the upper mandrels 34. Spacer-forming layer 60 may be formed of silicon nitride, silicon dioxide, or any type of organic or inorganic material having etch selectivity with respect to upper mandrels 32 and 34.

Figure 7:
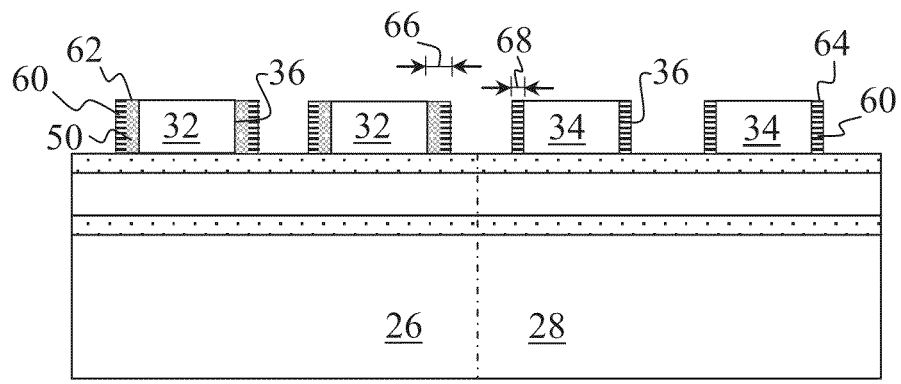

In FIG. 7, the spacer-forming layer 50 and spacer-forming layer 60 are etched to form upper spacer structures 62 in the first region 26 and upper spacer structures 64 in the second region 28. An exemplary etch uses an RIE process with chemistries based upon $CHF_3$ or $CF_4$ to etch silicon oxide or silicon oxynitride, or upon $CHF_3/O_2$ to etch silicon nitride. As shown, the upper spacer structures 62 are formed by adjoined vertical segments of the spacer-forming layer 50 and spacer-forming layer 60 that are adjacent the sidewalls 36 of the upper mandrels 32. The upper spacer structures 62 are thus formed with a width, indicated by arrows 66, that is substantially equal to the thickness of the vertical segments of the spacer-forming layer 50 and spacer-forming layer 60. The upper spacer structures 64 are formed by vertical segments of the spacer-forming layer 60 that are adjacent the sidewalls 36 of the upper mandrels 34. Thus, the upper spacer structures 64 are formed with a uniform width, indicated by arrows 68, that is substantially equal to the thickness of the vertical segment of the spacer-forming layer 60. As shown, thickness 66 is greater than thickness 68.

Figure 8:
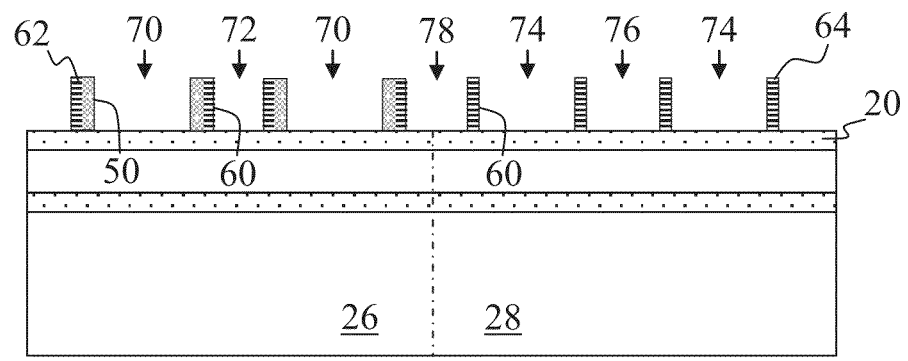

As illustrated in FIG. 8, the upper mandrels 32 and 34 are removed from the patternable structure 11, leaving the upper spacer structures 62 and 64 on the upper hard mask layer 20. In an exemplary embodiment, the upper mandrels 32 and 34 are removed by a reactive ion etch selective to the upper mandrels 32 and 34 in relation to the upper spacer structures 62 and 64 and the upper hard mask layer 20. Removal of the upper mandrels 32 results in the formation of gaps 70 and 72 in the first region 26. Each gap 70 is bound by opposite segments of the spacer-forming layer 50 while each gap 72 is bound by opposite segments of the spacer-forming layer 60. Gaps 70 have a width substantially equal to the thickness of the upper mandrels 32 while gaps 72 have a width substantially equal to the distance between the upper mandrels 32 minus two times the width 66. Design of the mandrels 32 may be controlled to determine whether the widths of gaps 70 are greater than, equal to, or less than the widths of gaps 72.

Removal of the upper mandrels 34 results in the formation of gaps 74 and 76 in the second region 28. Gaps 74 and 76 are both bound by segments of the spacer-forming layer 60; however, gaps 74 and 76 may be formed with different widths. Specifically, gaps 74 have a width substantially equal to the thickness of the upper mandrels 34 while gaps 76 have a width substantially equal to the distance between the upper mandrels 34 minus two times the width 68. Design of the mandrels 34 may be controlled to determine whether the widths of gaps 74 are greater than, equal to, or less than the widths of gaps 76. As shown, a gap 78 is bound by segments of the spacer-forming layer 60 in terminal positions of the region 26 and region 28. As a result, the width of the gap 78 is substantially equal to the distance between mandrels 32 and 34 minus the width 66 and minus the width 68. As may be seen below, the variable widths of the gaps 70-78 provide for variable feature pitches.

Figure 9:
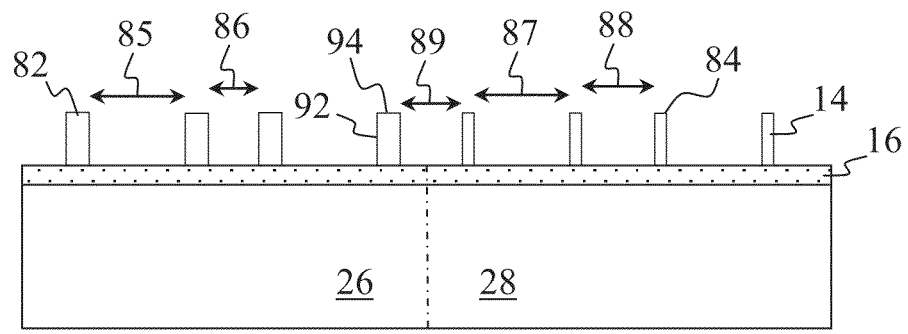

In FIG. 9, portions of the upper hard mask layer 20 and the lower patternable layer 14 exposed by gaps 70, 72, 74, 76 and 78, i.e., those portions not directly underlying the upper spacer structures 62 and 64, are etched. For example, an anisotropic etch may be performed by a timed reactive ion etch process selective to the hard mask layer 20 and lower patternable layer 14. As a result, lower patterned features 82 and 84, or lower mandrels, are formed from the lower patternable layer 14 overlying the lower hard mask layer 16. Specifically, patterned features 82 are formed in first region 26 and patterned features 84 are formed in second region 28. The upper hard mask layer 20 may be removed during the feature-forming etch or in a subsequent removal process. As shown, the lower patterned features 82 formed in the region 26 have a uniform width equal to width 66 (see FIG. 7) and the lower patterned features 84 in the region 28 have a uniform width equal to width 68 (see FIG. 7).

Further, the lower patterned features 82 are separated from one another by distances indicated by double-headed arrows 85 and 86. Distance 85 is equal to the thickness of the upper mandrel 32, and distance 86 is equal to the distance between upper mandrels 32 minus two times the width 66. The lower patterned features 84 are separated from one another by distances indicated by double-headed arrows 87 and 88. Distance 87 is equal to the thickness of the upper mandrel 34 (and equal to distance 85 in the exemplary embodiment), and distance 88 is equal to the distance between upper mandrels 34 minus two times the width 68. Further, the distance 89 between the terminal lower patterned feature 82 and the terminal lower patterned feature 84 is equal to the distance between terminal upper mandrel 32 and terminal upper mandrel 34 minus the sum of widths 66 and 68. It is noted that widths 66 and 68 and the distances 85, 86, 87, 88 and 89 may be manipulated as desired through the relationships of the mandrels' thicknesses and pitches. As shown, the lower patterned features 82 and 84 have substantially vertical sidewalls 92 and substantially horizontal top surfaces 94.

Figure 10:
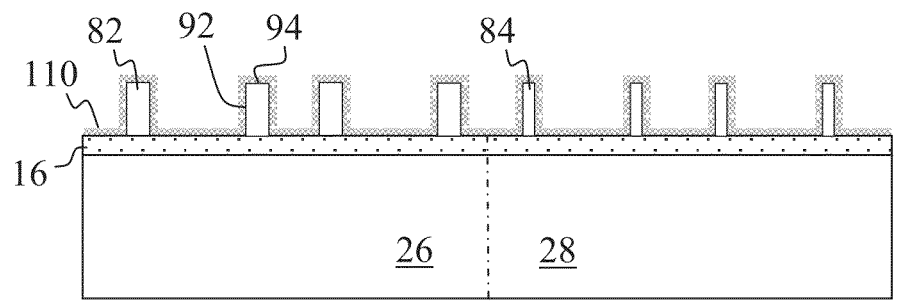

In FIG. 10, a spacer-forming layer 110 is formed over the patterned features 82 and 84 and the lower hard mask layer 16. An exemplary spacer-forming layer 110 is formed in the same or similar manner as spacer-forming layer 50 discussed above. Further, an exemplary spacer-forming layer 110 has the same composition as spacer-forming layer 50 discussed above. An exemplary spacer-forming layer 110 contacts the lower hard mask layer 16 and sidewalls 92 and top surfaces 94 of the patterned features 82 and 84.

Figure 11:
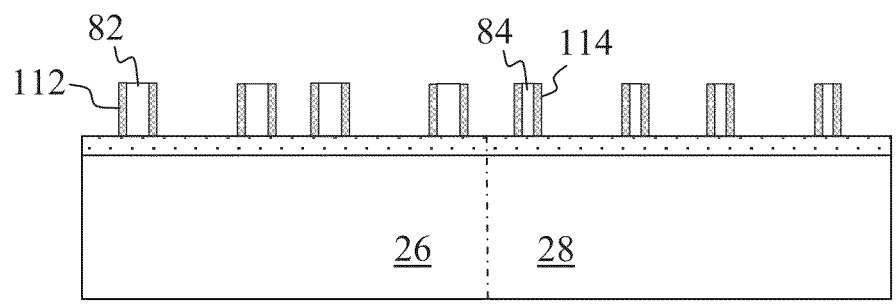
Figure 12:
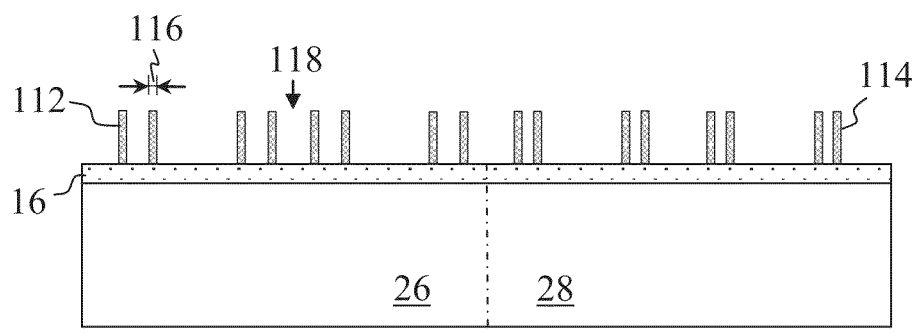

The spacer-forming layer 110 is etched in FIG. 11 to form spacer structures 112 adjacent the patterned features 82 in region 26 and spacer structures 114 adjacent the patterned features 84 in region 28. The etch may be the same or similar as the etch used to form spacer structures 62 and 64. As illustrated in FIG. 12, the patterned features 82 and 84 are removed, leaving the spacer structures 112 and 114 on the lower hard mask layer 16. In an exemplary embodiment, the patterned features 82 and 84 are removed by a reactive ion etch selective to patterned features 82 and 84 in relation to the spacer structures 112 and 114 and the lower hard mask layer 16. The spacer structures 112 and 114 are formed with a uniform width indicated by arrows 116. In an exemplary embodiment, the width 116 is about 10 nm to about 20 nm. As shown, openings 118 are defined between adjacent spacer structures 112 and/or 114.

Figure 13:
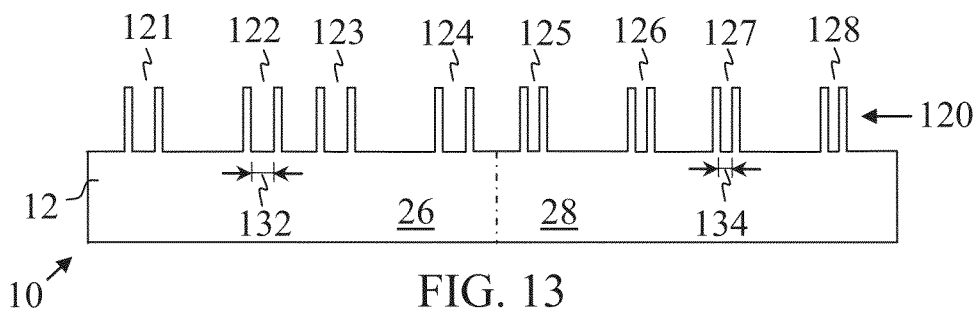

In FIG. 13, the portions of the lower hard mask layer 16 and the semiconductor substrate 12 exposed by openings 118, i.e., those portions not directly underlying the spacer structures 112 and 114, are etched. For example, an anisotropic etch may be performed by a timed reactive ion etch process selective to the lower hard mask layer 16 and semiconductor substrate 12. As a result, patterned features 120, such as fin structures, are formed from the semiconductor substrate 12. The lower hard mask layer 16 may be removed during the feature-forming etch or during a subsequent removal process. As shown, the patterned features 120 are formed in adjacent pairs 121-128. The patterned features 120 are formed with a substantially uniform width equal to the width 116 (see FIG. 12) of the spacer structures 112 and 114.

Within each pair 121-124 in region 26, each patterned feature 120 is separated from the other paired patterned feature 120 by a uniform intra-pair distance indicated by double-headed arrow 132. Exemplary intra-pair distance 132 is equal to the width 66 of the upper spacer structures 62 (see FIG. 7). Within each pair 125-128 in region 28, each patterned feature 120 is separated from the other paired patterned feature 120 by a uniform intra-pair distance indicated by double-headed arrow 134. Exemplary intra-pair distance 134 is equal to the width 68 of upper spacer structures 64 (see FIG. 7).

Figure 14:
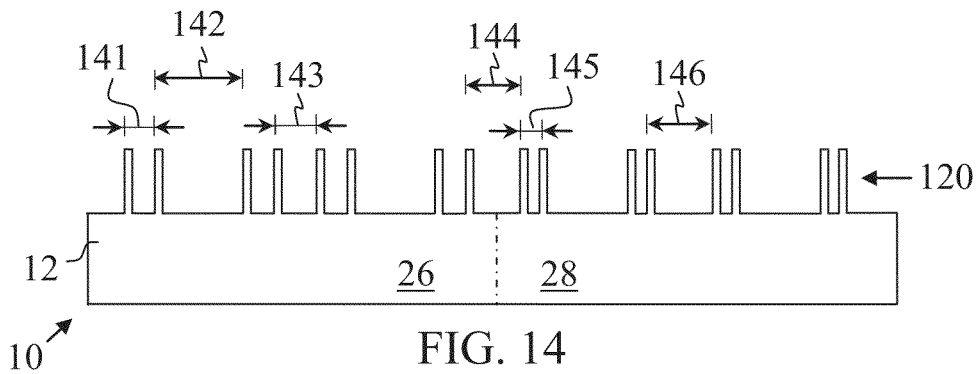

FIG. 14 illustrates the multiple pitches provided by the processing described in FIGS. 1-13. As shown, the patterned features 120 are formed with unique pitches 141, 142, 143, 144, 145 and 146. The unique pitches may be provided for by differentyle-sized mandrel widths and pitches (though the illustrated embodiment uses uniform mandrel width and mandrel pitch) and differently sized spacer structure widths. Referring to FIGS. 15-21 an embodiment is provided for forming patterned features with a higher number of unique pitches through providing additional spacer structure widths.

Figure 15:
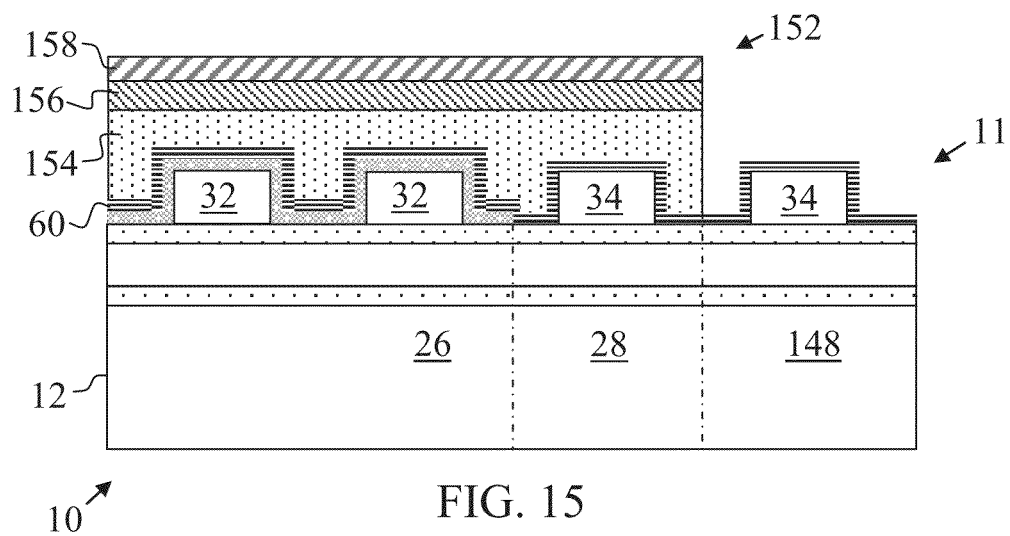

The processing of FIGS. 15-21 essentially repeats the steps of FIGS. 4-9 to form spacer structures with more thickness variability. The process begins with the structure of the partially fabricated integrated circuit 10 of FIG. 6. As shown in FIG. 15, the patternable structure 11 is considered to include a first region 26, a second region 28, and a third region 148. A mask 152 is formed and pattered over the patternable structure 11. The mask 152 may be formed in the same or similar way as mask 52 in FIG. 4. For example, mask 152 may include a plurality of lithographic-aiding layers including an optical planarizing layer (OPL) 154, an anti-reflective coating (ARC) layer 156 overlying the OPL 154, and a photoresist layer 158 overlying the ARC layer 156. The various layers may be formed as described in relation to FIG. 4 above. As shown, the photoresist layer 158 is patterned and the ARC layer 156 and OPL 154 are etched such that the mask 152 selectively covers the first region 26 and the second region 28 of the patternable structure 11, including the mandrels 32 in region 26 and the mandrels 34 in region 28. Accordingly, the mask 152 exposes the mandrels 34 in region 148.

Figure 16:
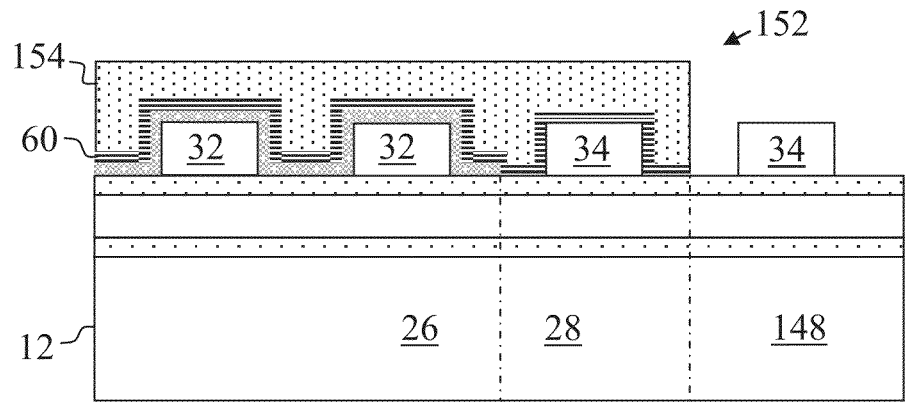

In FIG. 16, the spacer-forming layer 60 is etched and removed from the third region 148 including from the mandrels 34 in third region 148. An exemplary etch uses an RIE process with chemistries based upon $CHF_3$ or $CF_4$ to etch silicon oxide or silicon oxynitride, or upon $CHF_3/O_2$ to etch silicon nitride. The etch process may remove the photoresist layer 158 and the ARC layer 156, and may etch into the OPL 154. In exemplary embodiments, at least a portion of the OPL 154 remains overlying the spacer-forming layer 60 in the first region 26 and second region 28.

Figure 17:
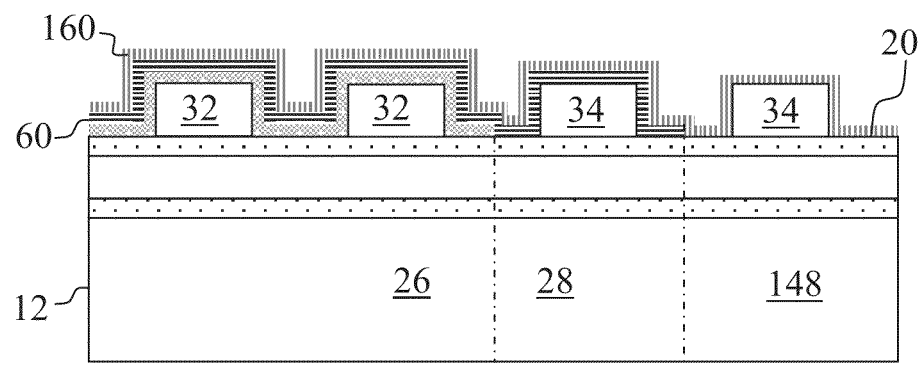

The OPL 154 is then removed in FIG. 17 and a spacer-forming layer 160 is formed over the remaining spacer-forming layer 60 in the first region 26 and second region 28 and over the upper hard mask layer 20 and the mandrels 34 in the third region 148. An exemplary spacer-forming layer 160 is conformally deposited such as by atomic layer deposition (ALD), plasma-enhanced chemical vapor deposition, a low pressure chemical vapor deposition, or another chemical vapor deposition process. An exemplary spacer-forming layer 160 contacts the sidewalls and horizontal surfaces of the spacer-forming layer 60, the hard mask layer 20 and the mandrels 34 in the region 148. Spacer-forming layer 160 may be formed of silicon nitride, silicon dioxide, or any type of organic or inorganic material having etch selectivity with respect to mandrels 32 and 34.

Figure 18:
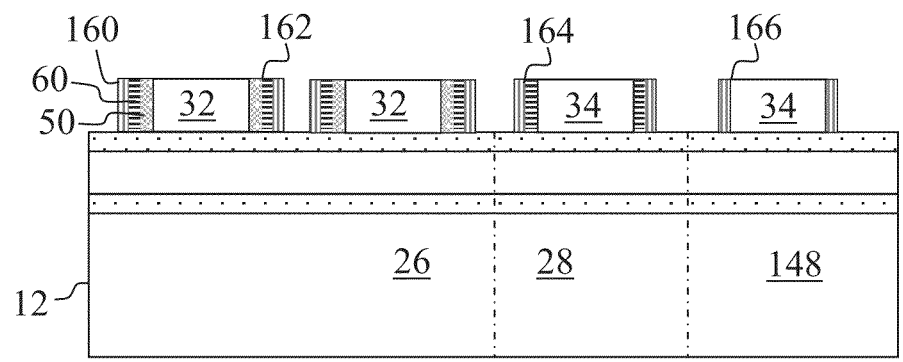
Figure 19:
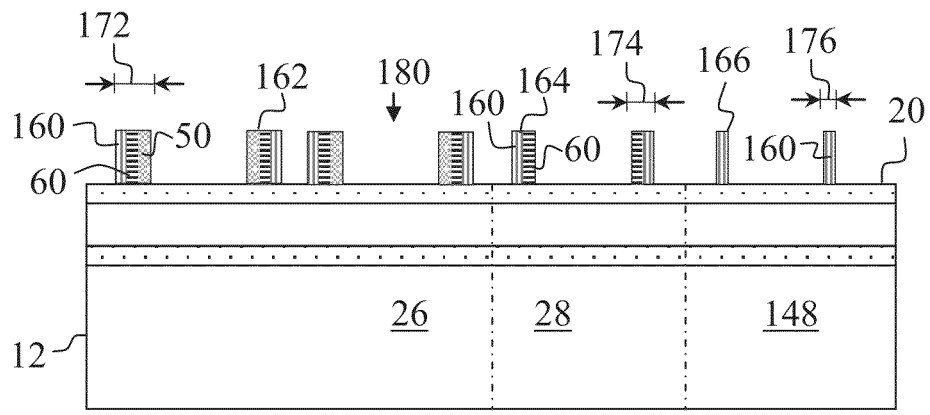

In FIG. 18, the spacer-forming layers 50, 60 and 160 are etched to form spacer structures 162 in first region 26, spacer structures 164 in second region 28, and spacer structures 166 in third region 148. An exemplary etch uses an RIE process with chemistries based upon $CHF_3$ or $CF_4$ to etch silicon oxide or silicon oxynitride, or upon $CHF_3/O_2$ to etch silicon nitride. As illustrated in FIG. 19, the mandrels 32 and 34 are then removed, leaving the spacer structures 162, 164, and 166 on the upper hard mask layer 20. In an exemplary embodiment, the mandrels 32 and 34 are removed by a reactive ion etch selective to the mandrels 32 and 34 in relation to the spacer structures 162, 164 and 166 and the upper hard mask layer 20.

As shown in FIG. 19, each spacer structure 162 in the first region 26 is formed from adjoined segments of the spacer-forming layers 50, 60 and 160 that were adjacent a sidewall of a mandrel 32. As a result, the width of each spacer structure 162, indicated by arrows 172, is substantially equal to the added thicknesses of the spacer-forming layers 50, 60 and 160. Each spacer structure 164 in the second region 28 is formed from a segment of the spacer-forming layers 60 and 160 that were adjacent a sidewall of a mandrel 34. As a result, the width of each spacer structure 164, indicated by arrows 174, is substantially equal to the added thicknesses of the spacer-forming layers 60 and 160. Each spacer structure 166 in the third region 148 is formed from a segment of the spacer-forming layer 160 that was adjacent a sidewall of a mandrel 34. As a result, the width of each spacer structure 166, indicated by arrows 176, is substantially equal to the thickness of the spacer-forming layer 160. Thus, the width 172 of the spacer structure 162 is greater than the width 174 of the spacer structure 164, which is greater than the width 176 of the spacer structure 166.

Figure 20:
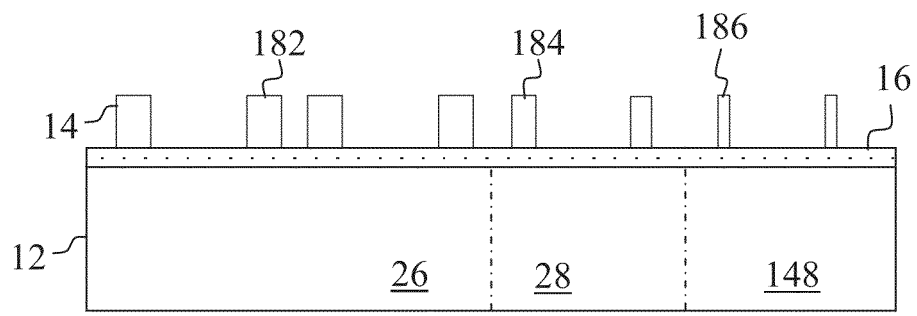

In FIG. 19, removal of the upper mandrels 32 and 34 results in the formation of gaps 180 between spacer structures 162, 164 and 166. In FIG. 20, portions of the upper hard mask layer 20 and the lower patternable layer 14 exposed by gaps 180, i.e., those portions not directly underlying the spacer structures 162, 164, and 166 are etched. For example, an anisotropic etch may be performed by a timed reactive ion etch process selective to the hard mask layer 20 and lower patternable layer 14. As a result, lower patterned features 182, 184, and 186, or lower mandrels, are formed from the lower patternable layer 14 overlying the lower hard mask layer 16. The upper hard mask layer 20 may be removed during the feature-forming etch or in a subsequent removal process. As shown, the lower patterned features 182 formed in the region 26 have a uniform width equal to width 172 (see FIG. 19), lower patterned features 184 in the region 28 have a uniform width equal to width 174 (see FIG. 19), and lower patterned features 186 in the region 148 have a uniform width equal to width 176 (see FIG. 19).

Figure 21:
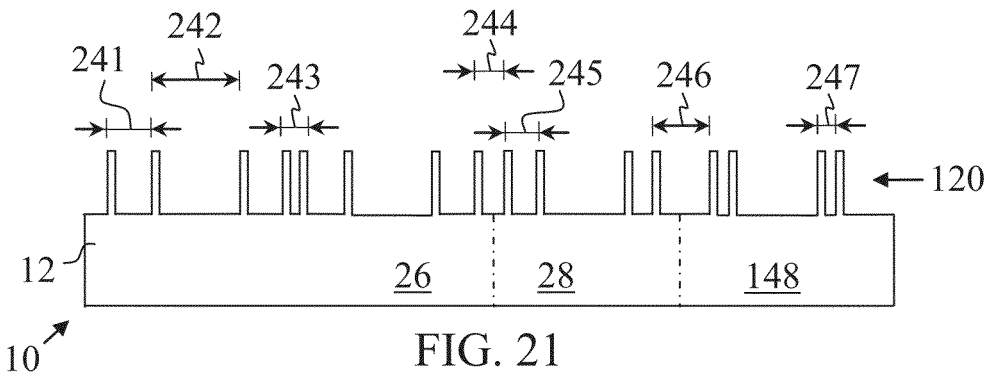

Processing of the partially fabricated integrated circuit 10 of FIG. 20 is continued according to the steps described in FIGS. 10-14, beginning with the deposition of spacer-forming layer 110 over regions 26, 28 and 148. With the inclusion of a lower mandrel having a third width different from the first and second widths, the processing illustrated in FIGS. 10-14 results in the formation of patterned features 120 from semiconductor substrate 12 having an increased number of pitches. For example, FIG. 21 illustrates the formation of patterned features 120 in regions 26, 28 and 148 from the patterned features 182, 184 and 186 of FIG. 20 through the processing steps of FIGS. 10-14. As shown, seven unique pitches 241, 242, 243, 244, 245, 246, and 247 are formed. Further, it is noted that the regions 28 and 148, having been illustrated with a single mandrel 34, do not include patterned features formed with a pitch determined by the formation of spacer structures between adjacent mandrels within the same region. Specifically, region 26 has three pitches 241, 242 and 243, while region 28 has one pitch 245, and region 148 has one pitch 247. Interregion pitches 244 and 246 are also provided. If regions 28 or 148 were provided with more than one mandrel 34, they would exhibit three pitches as region 26 does.

It is further noted that the steps of FIGS. 4-9 as shown in FIGS. 15-20 can be repeated for as many times as practical to form additional pitches as desired. In such embodiments, additional hard mask layers and patternable layers may be provided over the semiconductor substrate. Regardless of the number of times upper spacer structures are formed, formation of lower spacers, i.e., the spacers formed directly over the semiconductor substrate, having a uniform thickness will result in patterned features having uniform widths and variable pitches.

The integrated circuit fabrication methods described herein provide for integrated circuits with variably spaced features. Variable spacing of features, such as fin structures, enables formation of devices requiring different pitches, such as memory devices and logic devices, on a semiconductor substrate. As described herein, the variably spaced fin structures are provided with sub-lithographic widths and pitches through the use of a self-aligned quadruple patterning (SAQP) technique. The multiple SAQP processes described herein may be employed at various stages during integrated circuit fabrication including, but not limited to, gate level patterning and patterning of fins during fin field effect transistor (FET) fabrication, as well as other patterning stages during front-end-of-line (FEOL) or back-end-of-line (BEOL) processing.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for fabricating an integrated circuit, the method comprising:

providing a patternable structure having a first region and second region and including an upper mandrel layer overlying a lower mandrel layer;

etching upper mandrels from the upper mandrel layer in the first region and in the second region of the patternable structure;

forming first upper spacer structures having a first width adjacent the upper mandrels in the first region;

forming second upper spacer structures having a second width not equal to the first width adjacent the upper mandrels in the second region;

etching the lower mandrel layer using the first upper spacer structures and the second upper spacer structures as a first etch mask to form lower mandrels;

forming lower spacers adjacent the lower mandrels; and etching a material using the lower spacers as a second etch mask to form variably spaced features.

2. The method of claim 1 wherein forming first upper spacer structures and forming second upper spacer structures comprises:

forming first sidewall spacers adjacent the upper mandrels in the first region and in the second region;

removing the first sidewall spacers from the second region; and forming second sidewall spacers adjacent the first sidewall spacers in the first region and adjacent the upper mandrels in the second region, wherein each first upper spacer structure includes a selected first sidewall spacer and an adjacent second sidewall spacer, and wherein each second upper spacer structure includes a selected second sidewall spacer.

3. The method of claim 1 wherein forming first upper spacer structures and forming second upper spacer structures comprises:

forming first sidewall spacers adjacent the upper mandrels in the first region and in the second region;

selectively covering the first region with a mask;

etching the first sidewall spacers from the second region;

removing the mask from the first region; and forming second sidewall spacers adjacent the first sidewall spacers in the first region and adjacent the upper mandrels in the second region, wherein each first upper spacer structure includes a selected first sidewall spacer and an adjacent second sidewall spacer, and wherein each second upper spacer structure includes a selected second sidewall spacer.

4. The method of claim 1 wherein:

the patternable structure has a third region;

etching upper mandrels from the upper mandrel layer comprises etching upper mandrels from the upper mandrel layer in the first region, the second region and the third region;

the method further comprises forming third upper spacer structures having a third width not equal to the first width or the second width adjacent the upper mandrels in the third region; and etching the lower mandrel layer comprises etching the lower mandrel layer using the first upper spacer structures, the second upper spacer structures, and the third upper spacer structures as the first etch mask to form lower mandrels.

5. The method of claim 4 wherein forming first upper spacer structures, forming second upper spacer structures, and forming third upper spacer structures comprises:

forming first sidewall spacers adjacent the upper mandrels in the first region, in the second region, and in the third region;

removing the first sidewall spacers from the second region and the third region;

forming second sidewall spacers adjacent the first sidewall spacers in the first region and adjacent the upper mandrels in the second region and the third region, removing the second sidewall spacers from the third region; and forming third sidewall spacers adjacent the second sidewall spacers in the first region and the second region and adjacent the upper mandrels in the third region; wherein each first upper spacer structure includes a selected first sidewall spacer, an adjacent second sidewall spacer, and an adjacent third sidewall spacer; wherein each second upper spacer structure includes a selected second sidewall spacer and an adjacent third sidewall spacer; and wherein each third upper spacer structure includes a selected third sidewall spacer.

6. The method of claim 4 wherein forming first upper spacer structures, forming second upper spacer structures, and forming third upper spacer structures comprises:

forming first sidewall spacers adjacent the upper mandrels in the first region, in the second region, and in the third region;

selectively covering the first region with a first mask;

etching the first sidewall spacers from the second region and the third region;

removing the first mask from the first region;

forming second sidewall spacers adjacent the first sidewall spacers in the first region and adjacent the upper mandrels in the second region and the third region;

selectively covering the first region and the second region with a second mask;

etching the second sidewall spacers from the third region;

removing the second mask from the first region and the second region;

forming third sidewall spacers adjacent the second sidewall spacers in the first region and the second region and adjacent the upper mandrels in the third region; wherein each first upper spacer structure includes a selected first sidewall spacer, an adjacent second sidewall spacer, and an adjacent third sidewall spacer; wherein each second upper spacer structure includes a selected second sidewall spacer and an adjacent third sidewall spacer; and wherein each third upper spacer structure includes a selected third sidewall spacer.

7. The method of claim 1 wherein forming lower spacers adjacent the lower mandrels comprises forming lower spacers having a uniform width.

8. The method of claim 1 wherein etching the material using the lower spacers as the second etch mask to form variably spaced features comprises etching a bulk semiconductor material using the lower spacers as the second etch mask to form variably spaced semiconductor fin structures.

9. The method of claim 8 wherein etching the bulk semiconductor material using the lower spacers as the second etch mask to form variably spaced semiconductor fin structures comprises forming semiconductor fin structures with at least five unique semiconductor fin structure pitches.

10. The method of claim 8 wherein etching the bulk semiconductor material using the lower spacers as the second etch mask to form variably spaced semiconductor fin structures comprises forming pairs of semiconductor fin structures in the first region and pairs of semiconductor fin structures in the second region, wherein a first uniform intra-pair pitch is defined for paired semiconductor fin structures in the first region, and wherein a second uniform intra-pair pitch is defined for paired semiconductor fin structures in the second region.

11. A method for fabricating an integrated circuit, the method comprising:
   providing an upper mandrel layer overlying a lower mandrel layer overlying a semiconductor material; and
   performing a self-aligned quadruple patterning (SAQP) process to form variably spaced semiconductor fin structures from the semiconductor material, wherein the SAQP process includes:
      etching the upper mandrel layer to form a first upper mandrel distanced from a second upper mandrel;
      forming first upper spacer structures adjacent the first upper mandrel, wherein each first upper spacer structure has a first width;
      forming second upper spacer structures adjacent the second upper mandrel, wherein each second upper spacer structure has a second width not equal to the first width;
      removing the upper mandrels;
      etching the lower mandrel layer using the upper spacer structures as a first etch mask to form lower mandrels;
      forming lower spacers adjacent the lower mandrels;
      removing the lower mandrels; and
      etching the semiconductor material using the lower spacers as a second etch mask to form the variably spaced semiconductor fin structures.

12. The method of claim 11 wherein etching the semiconductor material using the lower spacers as the second etch mask to form the variably spaced semiconductor fin structures comprises forming semiconductor fin structures with at least five unique semiconductor fin structure pitches.

13. The method of claim 11 wherein etching the semiconductor material using the lower spacers as the second etch mask to form the variably spaced semiconductor fin structures comprises forming pairs of semiconductor fin structures in the first region and pairs of semiconductor fin structures in the second region, wherein a first uniform intra-pair pitch is defined for paired semiconductor fin structures in the first region, and wherein a second uniform intra-pair pitch is defined for paired semiconductor fin structures in the second region.

14. The method of claim 11 wherein forming lower spacers comprises forming lower spacers having a uniform width.

15. The method of claim 11 wherein forming the first upper spacer structure and forming the second upper spacer structure comprises:
   forming first sidewall spacers adjacent the first and second upper mandrels;
   forming a mask to selectively cover the first upper mandrel;
   etching the first sidewall spacers from the second upper mandrel;
   removing the mask from the first upper mandrel; and
   forming second sidewall spacers around the first sidewall spacers adjacent the first upper mandrel and adjacent the second upper mandrel, wherein each first upper spacer structure includes a selected first sidewall spacer and an adjacent second sidewall spacer, and wherein each second upper spacer structure includes a selected second sidewall spacer.

16. The method of claim 11 wherein etching the upper mandrel layer to form the first upper mandrel distanced from the second upper mandrel comprises forming a third upper mandrel distanced from the first upper mandrel and the second upper mandrel, wherein the method further comprises forming third upper spacer structures adjacent the third upper mandrel, and wherein each third upper spacer structure has a third width not equal to the first width or to the second width.

17. A method for forming a mask for fabricating an integrated circuit, the method comprising:
   etching an upper mandrel layer to form a first upper mandrel in a first region and a second upper mandrel in a second region;
   forming first upper spacer structures adjacent the first upper mandrel;
   forming second upper spacer structures adjacent the second upper mandrel;
   removing the upper mandrels;
   etching a lower mandrel layer using the first and second upper spacer structures as an etch mask to form lower mandrels;
   forming lower spacers adjacent the lower mandrels; and
   removing the lower mandrels, wherein the lower spacers define the mask for fabricating an integrated circuit with variably spaced features.

18. The method of claim 17 wherein:
   forming the first upper spacer structures and forming the second upper spacer structures comprises:
   forming first sidewall spacers adjacent the first and second upper mandrels;
   selectively covering the first upper mandrel with a first mask;
   etching the first sidewall spacers from the second upper mandrel;
   removing the first mask from the first upper mandrel; and
   forming second sidewall spacers around the first sidewall spacers adjacent the first upper mandrel and adjacent the second upper mandrel, wherein each first upper spacer structure includes a selected first sidewall spacer and an adjacent second sidewall spacer, and wherein each second upper spacer structure includes a selected second sidewall spacer.

19. The method of claim 18 wherein forming lower spacers adjacent the lower mandrels and removing the lower mandrels comprises establishing the lower spacers with at least five unique lower spacer pitches.

20. The method of claim 17 wherein:
   forming the first upper spacer structures comprises forming each first upper spacer structure with a first width;
   forming the second upper spacer structures comprises forming each second upper spacer structure with a second width not equal to the first width; and
   the method further comprises forming third upper spacer structures adjacent the third upper mandrel, and wherein each third upper spacer structure has a third width not equal to the first width or to the second width.

* * * * *